United States Patent [19]

Furlan

[11] Patent Number: 5,414,593
[45] Date of Patent: May 9, 1995

[54] ELECTRONIC UNIT FORMED BY TWO BOARDS JOINED BY ASSEMBLING MEANS

[75] Inventor: Eddy Furlan, Rungis, France
[73] Assignee: Thomson-CSF, Paris, France
[21] Appl. No.: 171,152
[22] Filed: Dec. 22, 1993

[30] Foreign Application Priority Data

Dec. 24, 1992 [FR] France ................ 92 15710

[51] Int. Cl.⁶ .................................. H05K 1/11
[52] U.S. Cl. ........................ 361/784; 361/748; 361/758; 361/788; 361/792; 174/268
[58] Field of Search ............ 361/748, 756, 758, 770, 361/784, 788, 789, 790, 792, 704; 439/845, 47; 174/268; 211/41; 248/223.4

[56] References Cited

U.S. PATENT DOCUMENTS 5,014,163  5/1991  Lin ................................ 361/415

FOREIGN PATENT DOCUMENTS 2575024  6/1986  France .
1797310  10/1959  Germany .
3328746  2/1985  Germany .

Primary Examiner—Leo P. Picard
Assistant Examiner—Young Whang
Attorney, Agent, or Firm—Oblon, Spivak, McClelland, Maier & Neustadt

[57] ABSTRACT

The disclosure relates to electronic units formed by two printed circuit type boards that are electrically and mechanically coupled and that have a single plug for their connection. To facilitate the placing of these units between two pairs of grooves, the assembling the two boards comprise adjusting elements to adjust the distance between the two boards to two distinct values: one when the boards are inserted into the grooves and the other for an effect of locking the boards between the pairs of grooves. To this end, it is possible to use bars crossed by a screw that makes it possible, by screwing, to place two outside sections of the bar in a position of overthrust with respect to an inside section of the bar. The screwing is done after the electronic unit has been inserted into the grooves in order to lock the boards against the flanks of the grooves.

4 Claims, 3 Drawing Sheets

5,414,593

ELECTRONIC UNIT FORMED BY TWO BOARDS JOINED BY ASSEMBLING MEANS

BACKGROUND OF THE INVENTION

The present invention relates to electronic units formed by two printed-circuit type boards joined by assembling means and electrical conductors, and comprising a plug behind only one of these boards, the two boards being designed so that they are placed simultaneously between grooves of a support and so that, at the end of the insertion, the plug penetrates a corresponding plug receptacle that is fixedly joined to the support.

The insertion of a single board so that it is placed between grooves already requires a certain degree of care, and the difficulties of insertion are appreciably greater with an electronic unit formed by two boards especially when each of these two boards has a dissipative face designed to remove calories produced during the working of the board. Indeed, in this case, the dissipative faces of these two boards then have to be placed appropriately against the walls of the grooves in order to promote the dissipation of calories by conduction. In known units, the two boards enter between their respective grooves with hard friction and the operation proves to be difficult.

SUMMARY OF THE INVENTION

The aim of the invention is to circumvent this drawback or at least to reduce it.

This is obtained by the designing of assembling means such that they enable the spacing between the two boards to be adjusted according to two distinct values: one value for which the two boards slide almost without friction in their respective grooves and one value for which each of the boards has one of its faces pressed heavily against one wall of each of the two grooves between which it is placed. With the boards that comprise a dissipative face, it is clearly this dissipative face that is pressed against the walls of the grooves.

According to the present invention, there is provided an electronic unit comprising a first board and a second board, each board having a front edge, a rear edge and two side edges, flexible conductors to connect the two boards, a plug fixedly joined to the rear edge of the first board and assembling means comprising a plate to assemble the two boards in parallel to each other and perpendicularly to the plate, the two boards being designed to be inserted into two pairs of parallel grooves so as to be placed between these pairs of parallel grooves with their lateral edges within the grooves and the assembling means comprising adjusting elements to adjust the distance between the two boards to two distinct values, one when the boards are inserted into the grooves and the other for an effect of locking the boards between the pairs of grooves.

BRIEF DESCRIPTION OF THE DRAWINGS

The present invention will be understood more clearly from the following description and from the figures pertaining thereto. Of these figures.

MORE DETAILED DESCRIPTION

Figure 1:
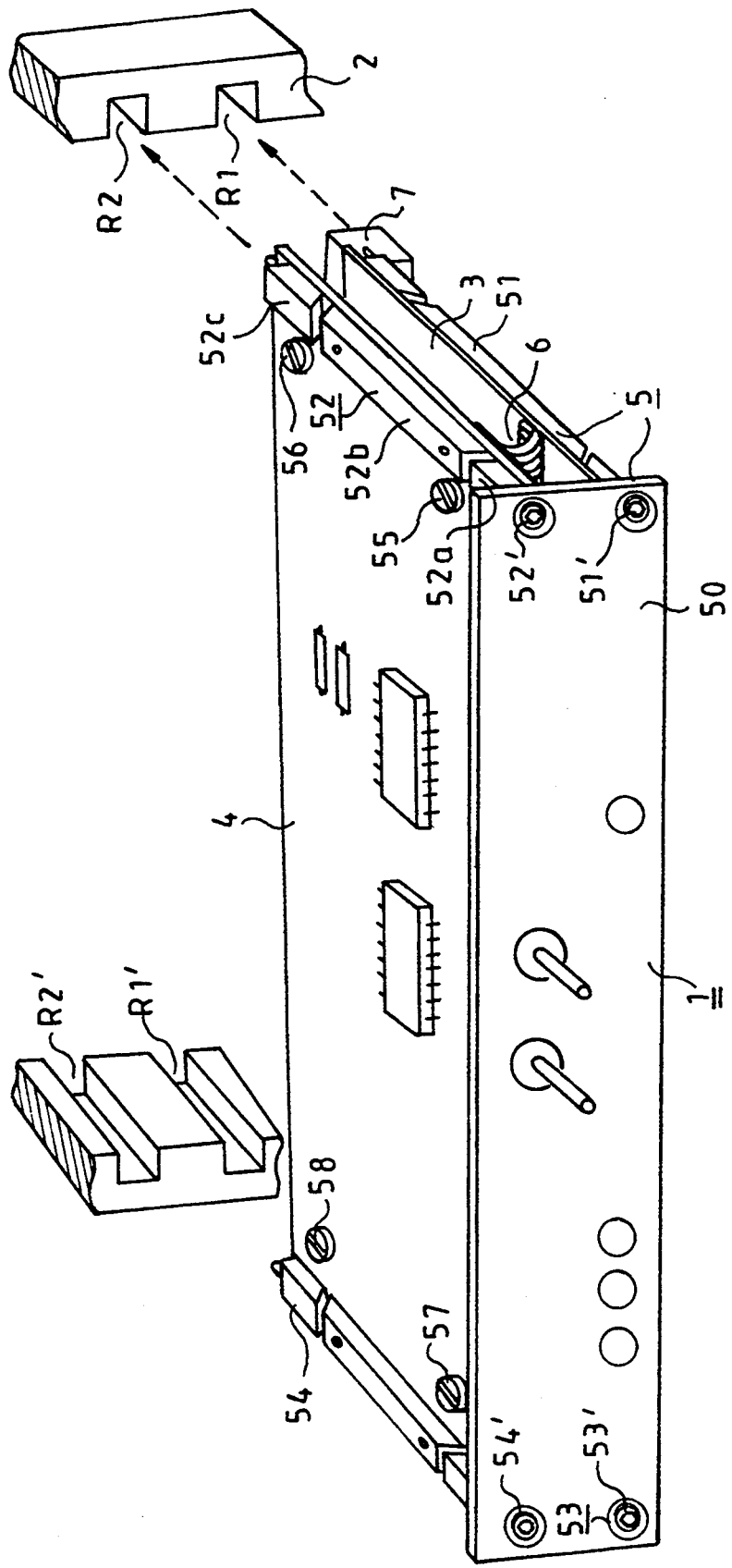
FIG. 1 shows a view in perspective of an electronic assembly according to the invention.

FIG. 1 shows an electronic unit 1 constituted by a rack. This shelf is an element of a piece of electronic equipment comprising a frame 2 with grooves R1, R1', R2, R2' designed to enable the insertion of the rack in the frame. In FIG. 1, the rack appears in its entirety whereas, as far as the rest of the equipment concerned, only the part of the frame that is in the vicinity of the grooves has been drawn.

The electronic unit 1 comprises two boards 3, 4, namely printed circuits with their components, assembling means 5 for the mechanical joining of the two boards, flexible conductors joined in a flexible strip 6 to provide for the electrical links between the two boards and an electric plug 7 positioned in the rear of the board 3 to enable the unit 1 to be connected electrically to the rest of the electronic equipment of which it forms a part. The two boards have the same dimensions and are positioned side by side with their large faces being parallel.

The assembling means 5 comprise a front plate 50 that constitutes the front face of the rack, four adjusting elements of which only three, 51, 52, 54, appear clearly in FIG. 1 and four spacer elements 55 to 58.

The adjusting elements are formed by a large rectangular-sectioned bar slotted in a slantwise direction in the vicinity of each of its two ends to form three sections such as 52a, 52b and 52c. The four bars are fixed by their inside section, such as 52b, to the large faces of the parallelepiped constituted by the two boards, in the vicinity of the small sides of these large faces. Each bar comprises a screw 51' to 54' that freely crosses the three sections except the vicinity of its point where it passes through a hole tapped with a thread corresponding to its own thread. The heads of these screws are hexagonal socket heads that can be seen in FIG. 1 and are accessible by holes drilled in the plate 50. Thus, by screwing or unscrewing a screw such as 52', it is possible, owing to the slantwise slots that separate the sections of one and the same bar, to see to it that the external sections such as 52a, 52c are in a position of overthrust with respect to the inside section in varying degrees and thus move away, in varying degrees and simultaneously, from their respective boards.

Figure 3:
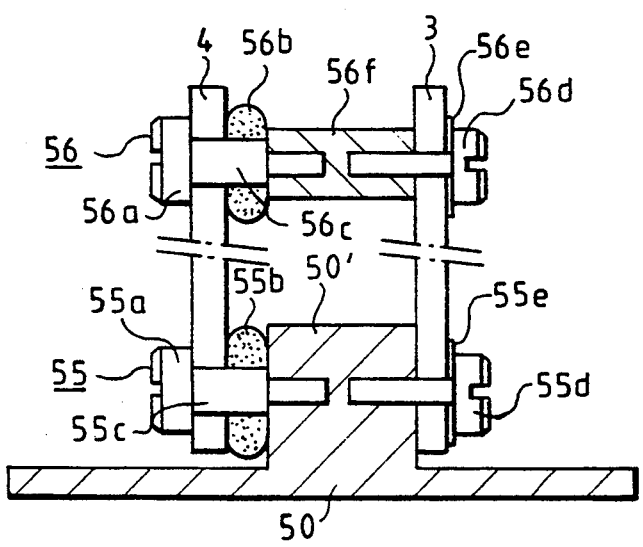
Figure 4:
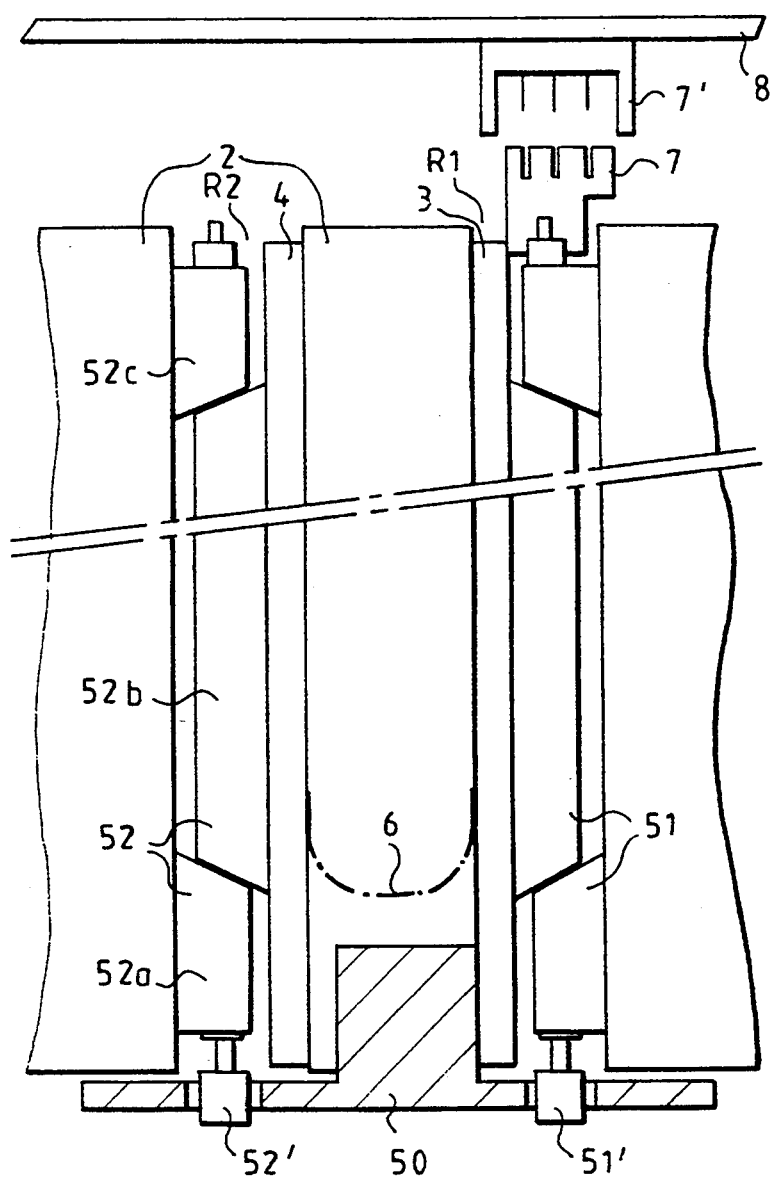
Figure 5:
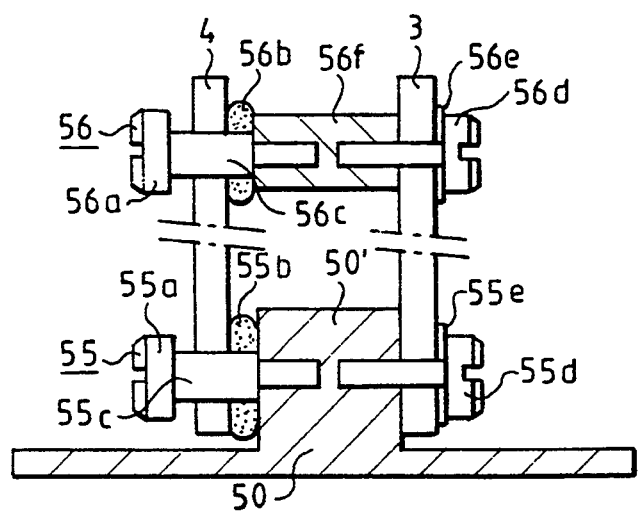

The spacer elements 55 to 58 shall be described by means of FIGS. 3 to 5.

Figure 2:
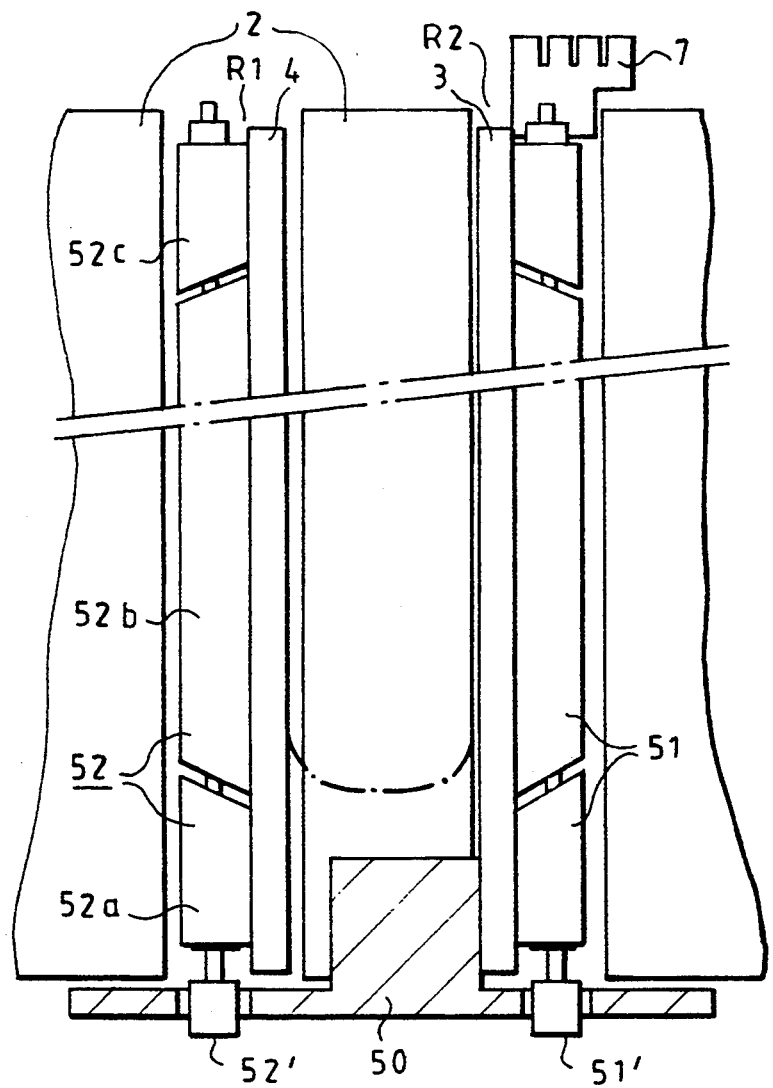
FIGS. 2 to 5 show sectional views of the unit according to FIG. 1.

FIGS. 2 and 4 are views obtained after a sectioning through a plane positioned at a distance from the bottom of the grooves R1 and R2 that is equal to about half the depth of these grooves. The section is made in the frame 2 and in the plate 50 of the electronic unit 1 and shows the two boards 3, 4 while they are fully inserted into the grooves R1, R2. FIG. 4 shows a board 8, called a mother board, that is fixedly joined to the frame 2. This mother board has a plug receptacle 7' that corresponds to the plug 7 of the electronic unit 1. It must be noted that since, in FIGS. 2 and 4, the two boards are fully inserted into the grooves, the plug 7 is then fully inserted into the plug receptacle 7', but it has been deemed to be preferable to show this plug receptacle 7' in a slightly withdrawn position in FIG. 4 so that its structure appears more clearly. In the example described, the plug receptacle 7' is provided with contacts that are mobile on approximately ±3 mm about a resting position, in a direction that perpendicular to the direction of penetration of the plugs and is located in the plane of FIGS. 2 and 4. Connectors wherein the plug receptacle, while being joined to a fixed support, has contacts that can follow the small-amplitude lateral shifts of the plug, are commercially available, for example under the name of "SIHD type connectors". The utility of such connectors shall appear hereinafter.

In FIG. 2, the bars 51 and 52 are shown in the position given to them so that, with the boards 3 and 4, they can easily penetrate the grooves R1 and R2. This position is the one where the screws 51' and 52' are not tightened and where, consequently, the outside sections of the bars are not in overthrust with respect to the inside section.

By contrast, as soon as the boards have been inserted, the four screws such as 51' and 52' can be tightened so as to bring about the overthrust, in each of the four bars, with respect to the inside section, such as 52b, by the two outside sections such as 52a and 52c. FIG. 4 corresponds to FIG. 2 after the tightening of the screws and, hence, the overthrust of the sections of each of the four bars.

As can be seen in FIG. 4, this overthrust has the effect of bringing the external sections such as 52a, 52c into contact with one of the two vertical walls of the groove, such as R2 and, by pushing the internal section in the other direction, of bringing the board such as 4 into contact with the other vertical wall of the groove. It must be noted firstly that, in these motions which bring the boards into contact with the walls of the grooves, the plug 7, which is fixedly joined to the board 3 and has already been inserted into the plug receptacle 7', gets shifted slightly. This explains the choice that has been made, as explained further above, of a connector 7-7' with mobile contacts. It must be noted, secondly, that in the example described, each of the two boards has a thermal drain, namely a metal plate that facilitates the discharging, into the external environment, of the calories produced in the board. The board thus shows a face called a dissipative face. In order to provide for optimum discharge of the calories produced in the boards, the dissipative faces of the boards 3 and 4 are turned towards each other so that they come into contact, on two of their sides, with the wall of the grooves R1 and R2 and so that, in this way, the frame 2 in which the grooves are made acts as a heat sink for the discharge of the calories produced in the boards. If the fastening of the bars 51, 52 to the boards 3 and 4 had been done not on either side of the boards, as in the example described, but between these boards, then the dissipative faces would have been turned towards the exterior of the parallelogram formed by the two boards so that each one of them would come into contact with the walls of grooves. This means that when the adjusting elements used to adjust the spacing between the two boards are fixed either to the faces of the boards that are turned towards each other or to the opposite faces, the dissipative faces of these boards will be respectively the opposite faces or the faces turned towards each other.

Here above, the spacer elements 55 to 58, which are designed to hold the two boards substantially in parallel planes and to permit the modification of the distance between these two boards, have been mentioned only with respect to the description of FIG. 1. They shall be described in greater detail with the help of FIGS. 3 and 5.

FIGS. 3 and 5 are sectional views along a plane perpendicular to the large faces of the boards and passing through the spacer elements 55, 56. Identical figures would have been obtained by making the sectional plane pass through the spacer elements 57, 58. FIG. 3 corresponds to the case already dealt with by means of FIG. 2, namely the case where the boards 3, 4 of the electronic element 1 have been moved apart to the maximum extent and where the sections of the bars 51 to 54 are not in a position of overthrust. FIG. 5, for its part, corresponds to the case, already described with the help of FIG. 4, in which the electronic element 1 is wedged in the grooves by means of the overthrust of the sections of these bars.

As can be seen in FIGS. 3 and 5, each spacer element has two screws such as 55a, 55d and 56a, 56d. The two screws of one and the same spacer element are in the zone of extension of each other and have their tips facing each other. The screws 55a, 56a and 55d, 56d respectively go through the boards 4 and 3 to get screwed into a brace such as 50' for 55a and 55d and into a brace such as 56f for 56a and 56d. The brace 56f is an autonomous cylindrical part while the brace 50' is a protuberance behind the plate 50. Before crossing the board 3 and getting screwed respectively into the braces 50', 56f, the screws 55d, 56d cross a washer 55e, 56e. As for the screws 55a, 56a, before getting screwed respectively into the braces 50', 56f, they go through a hollow sleeve 55c, 56c which itself goes through the board 4 and then a rubber ring 55b, 56b.

The working of the spacer elements of the electronic unit 1 can easily be understood by means of FIGS. 3 and 5:

so long as the adjusting elements formed by the bars 51 to 54 and examined with reference to FIGS. 1, 2 and 4 do not have their sections in a state of overthrust, the rubber rings such as 55b, 56b which, besides, are slightly compressed, push back the board 4 which is held by the heads of the screws such as 55a, 56a. This is illustrated by FIG. 3.

when the sections of the adjusting elements overthrust and, in pressing on the walls of the slots, approach the boards 3 and 4, the board 4, in being pushed towards the board 3, moves away from the heads of the screws such as 55a, 56a and presses strongly on the rubber rings such as 55b, 56b. These rings get flattened as can be seen in FIG. 5.

The present invention is not limited to the example described and to its variant according to which, after the insertion of the two boards into the grooves, the blocking effect is obtained through the increasing, by adjusting elements, of the distance between the two boards. The invention can be applied more generally to any structure of an electronic unit made of two boards and comprising adjusting elements to enable a choice between two distinct values for the distance between the two boards.

Thus, it is possible to envisage the making of a board which, having no plug, can slide on two rails placed behind the front plate, perpendicularly to the plane of the boards, and if the boards are rigid enough, it is possible to envisage a structure in which the spacer elements are not used. On the contrary, the insertion of the electronic unit will make it necessary, by manual adjustment, to give a value that enables this insertion to the distance between the boards. As for the spacer elements, they may comprise, for example, a hollow cylinder, a helical spring inside the cylinder, a piston that presses on the spring and one or two limit stops to limit the travel of the piston. It is even possible to use jacks positioned between the two boards to constitute, with each board, both an adjusting element and a spacer element.

What is claimed is:

1. An electronic unit, comprising: a first board and a second board, said first board and said second board each having a front edge, a rear edge and two side edges; at least one flexible conductor to connect said first board and said second board; a plug fixedly joined to the rear edge of said first board; and assembling means comprising a plate to assemble said first board and said second board in parallel to each other and perpendicularly to said plate, and said assembling means further comprising adjusting elements to adjust a distance between said first board and said second board to at least two distinct values, which is one value of said at least two values when said first board and said second board are respectively inserted into a first pair and a second pair of parallel grooves so as to position each side edge of said two side edges within a respective one of said parallel grooves, and which is another value of said at least two values when said first board and said second board are respectively locked within said first pair and said second pair of parallel grooves.

2. An electronic unit according to claim 1, wherein each of said first board and said second board has a dissipative face, with the dissipative face of said first board positioned in facing relation to the dissipative face of said second board, and wherein said one value of said at least two values is greater than said another value of said at least two values.

3. An electronic unit according to claim 1, wherein said adjusting elements comprise four sectioned bars, each of said four sectioned bars having an inside section and two external sections respectively arranged adjacent said inside section, said inside section having a sloping edge adjacent a sloping edge of each of said two external sections, each of said four sectioned bars further comprising a screw that crosses a respective said inside section, each said screw comprising a head located adjacent to one end of a respective one of said four sectioned bars and adjacent to said plate, and each said screw further comprising a tip that engages one of said external sections at the other end of the respective one of said four sectioned bars, and each of said inside sections respectively engaging a respective one of said first board and said second board adjacent to a respective one of said side edges.

4. An electronic unit according to any one of claims 1, 2 or 3, wherein said assembling means further comprises spacer elements, each of said spacer elements mechanically connecting said first board and said second board, and wherein each of said spacer elements has a compressible portion compressible in a direction perpendicular to said first board and said second board.

* * * * *